(12) United States Patent  (10) Patent No.: US 9,257,398 B2
Kim  (45) Date of Patent: Feb. 9, 2016

(54) SEMICONDUCTOR DEVICE AND METHOD FOR FORMING THE SAME

(71) Applicant: SK HYNIX INC., Icheon (KR)

(72) Inventor: Jung Sam Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/313,963

(22) Filed: Jun. 24, 2014

(65) Prior Publication Data

US 2015/0262946 A1  Sep. 17, 2015

(30) Foreign Application Priority Data

Mar. 14, 2014  (KR) ........................ 10-2014-0030355

(51) Int. Cl.
*H01L 23/00*  (2006.01)
*H01L 27/088*  (2006.01)
*H01L 29/423*  (2006.01)

(52) U.S. Cl.
CPC .............. *H01L 24/05* (2013.01); *H01L 23/562* (2013.01); *H01L 27/088* (2013.01); *H01L 29/4236* (2013.01); *H01L 2224/04042* (2013.01); *H01L 2224/05083* (2013.01); *H01L 2224/05184* (2013.01); *H01L 2924/01014* (2013.01); *H01L 2924/01032* (2013.01); *H01L 2924/0484* (2013.01); *H01L 2924/04941* (2013.01); *H01L 2924/13091* (2013.01); *H01L 2924/1436* (2013.01); *H01L 2924/1443* (2013.01)

(58) Field of Classification Search
CPC ................................... H01L 27/108–27/10897
See application file for complete search history.

(56) References Cited

U.S. PATENT DOCUMENTS

| | | | | |
|---|---|---|---|---|
| 6,163,074 | A * | 12/2000 | Lee et al. ....................... | 257/734 |
| 2001/0010407 | A1* | 8/2001 | Ker et al. ...................... | 257/781 |
| 2002/0003305 | A1* | 1/2002 | Umakoshi et al. ............ | 257/760 |
| 2003/0008469 | A1* | 1/2003 | Hwang et al. ................. | 438/396 |
| 2003/0064578 | A1* | 4/2003 | Nakamura et al. ............ | 438/627 |
| 2003/0077896 | A1* | 4/2003 | Saito et al. .................... | 438/622 |
| 2003/0094634 | A1* | 5/2003 | Cho et al. ...................... | 257/212 |
| 2006/0086961 | A1* | 4/2006 | Iijima et al. ................... | 257/303 |
| 2010/0219502 | A1 | 9/2010 | Shieh et al. | |
| 2011/0006353 | A1* | 1/2011 | Kim et al. ..................... | 257/300 |
| 2011/0045650 | A1* | 2/2011 | Maekawa ...................... | 438/396 |
| 2012/0153436 | A1* | 6/2012 | Hasunuma .................... | 257/532 |
| 2013/0062733 | A1* | 3/2013 | Summerfelt et al. ......... | 257/532 |

FOREIGN PATENT DOCUMENTS

KR  10-2012-0088134 A  8/2012

OTHER PUBLICATIONS

U.S. Appl. No. 14/181,039, filed Feb. 14, 2014, Jung Sam Kim.

* cited by examiner

*Primary Examiner* — Tucker J Wright

(57) ABSTRACT

A semiconductor device includes a first pad region including a plurality of first storage nodes, a second pad region neighboring the first pad region and including a plurality of second storage nodes, a coupling portion disposed between the first pad region and the second pad region, and a plate electrode disposed over the plurality of first storage nodes of the first pad region and the plurality of second storage nodes of the second pad region, and disposed in the coupling portion to interconnect the first pad region and the second pad region.

15 Claims, 11 Drawing Sheets

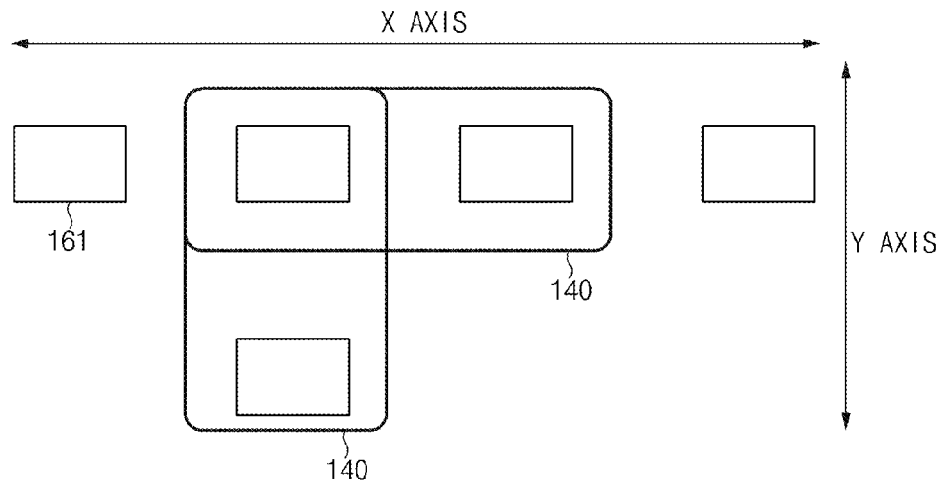
Fig.1A (i)
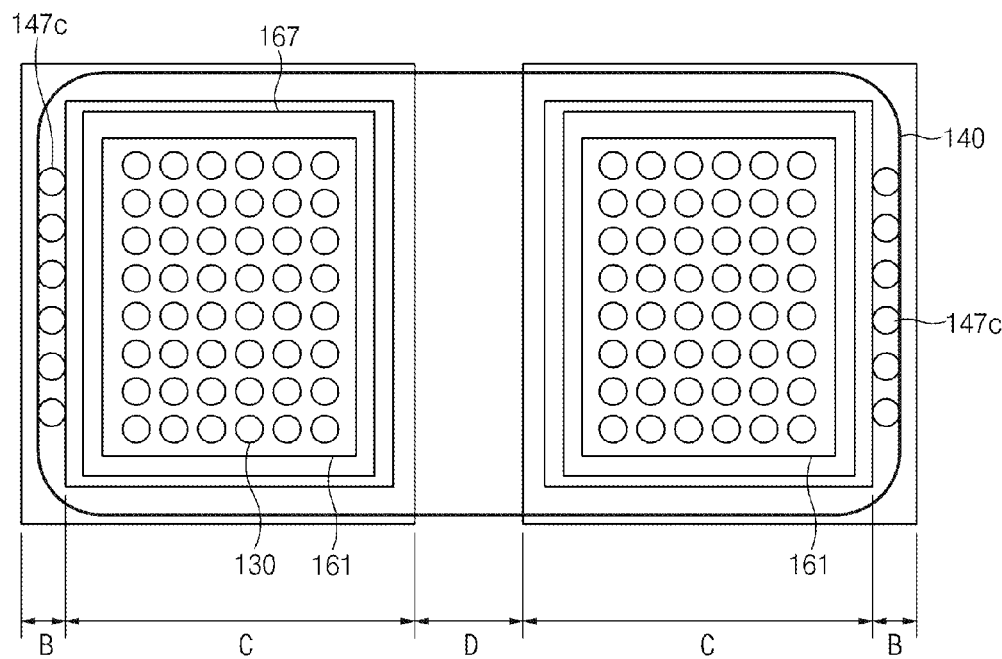
Fig.1A (ii)

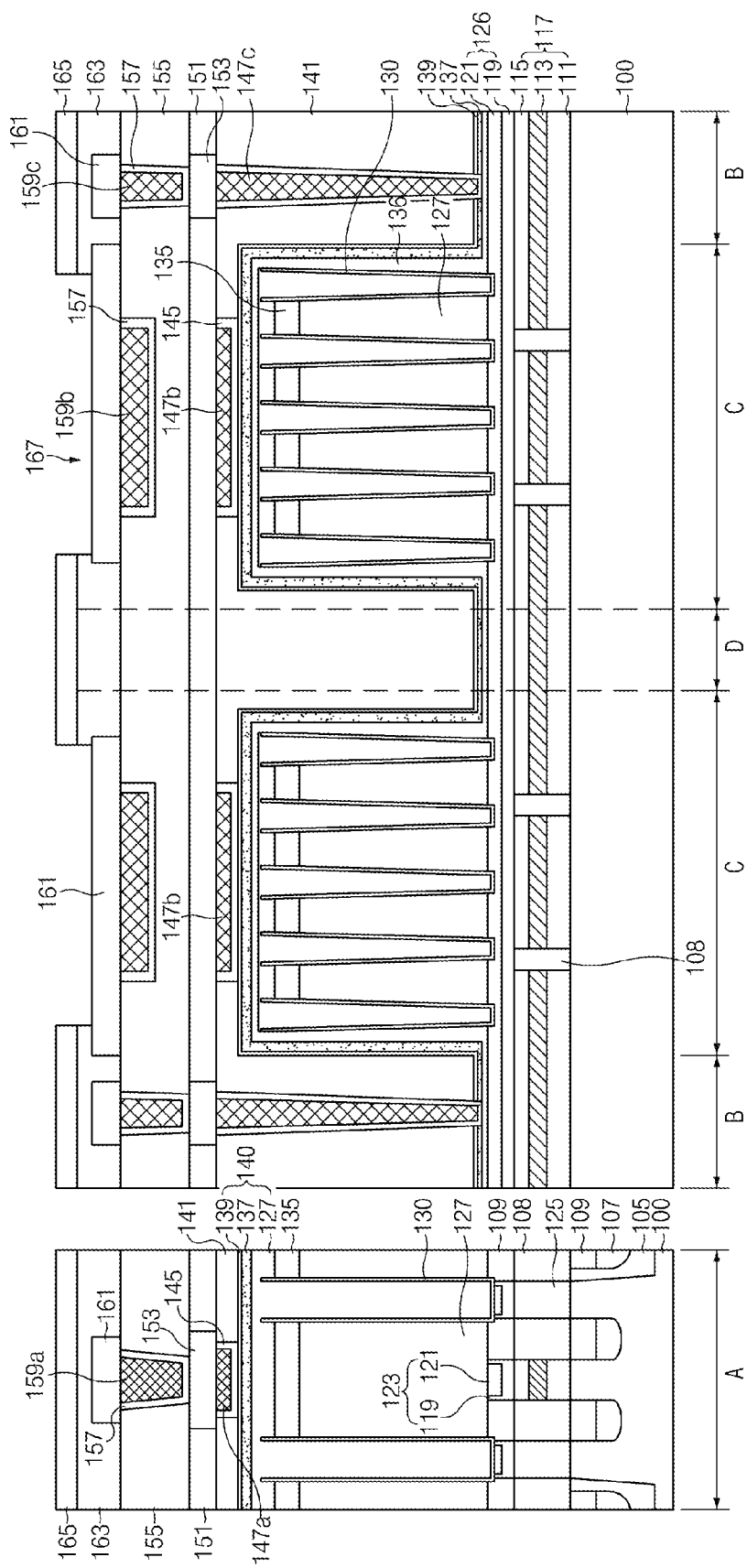

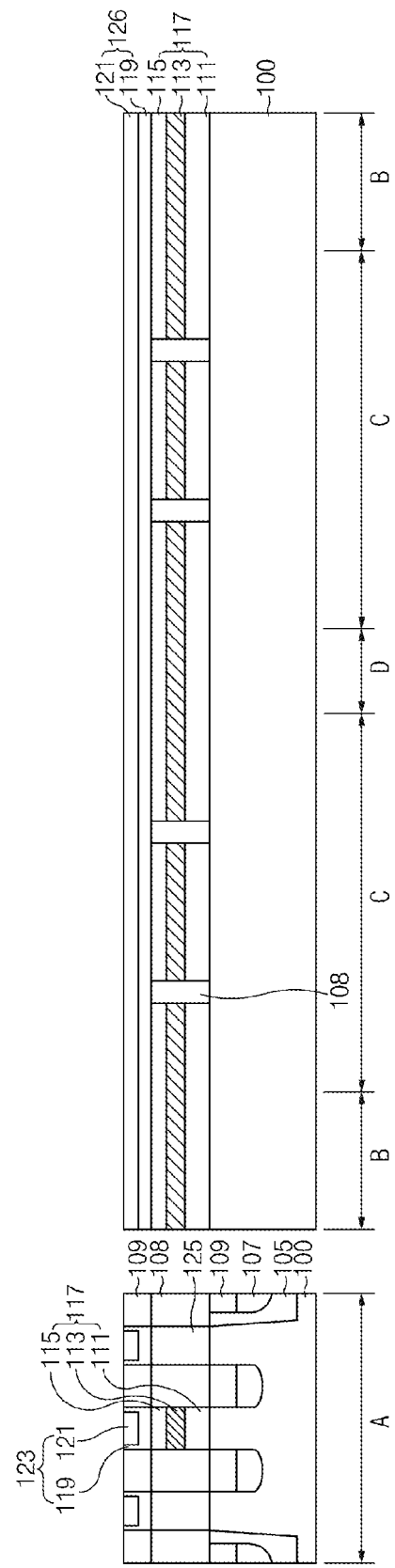

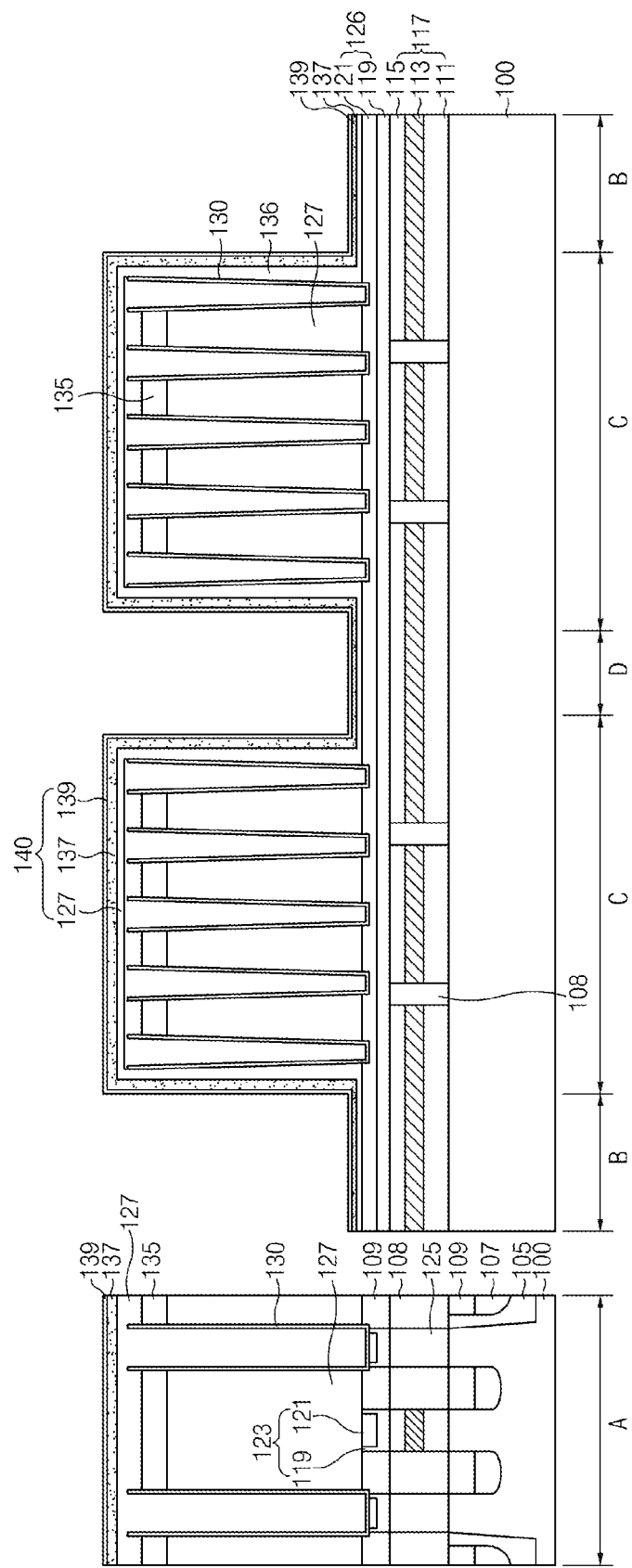

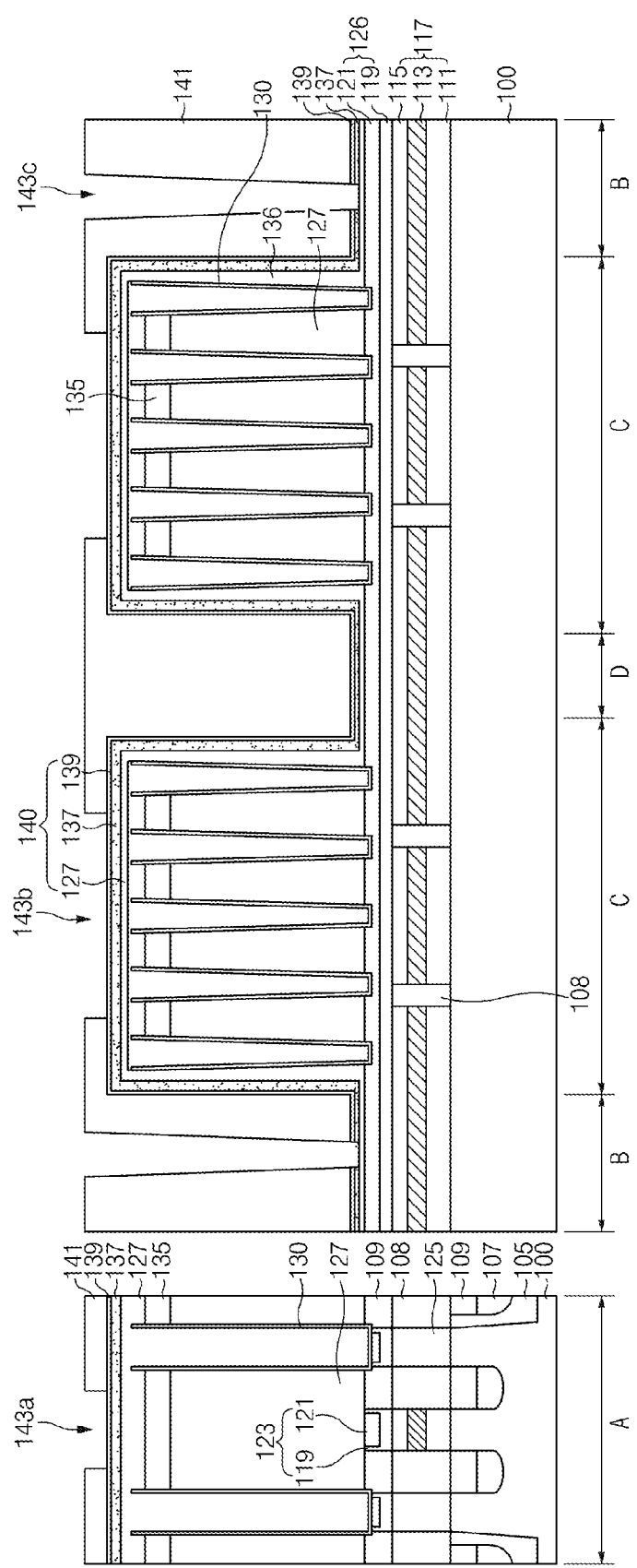

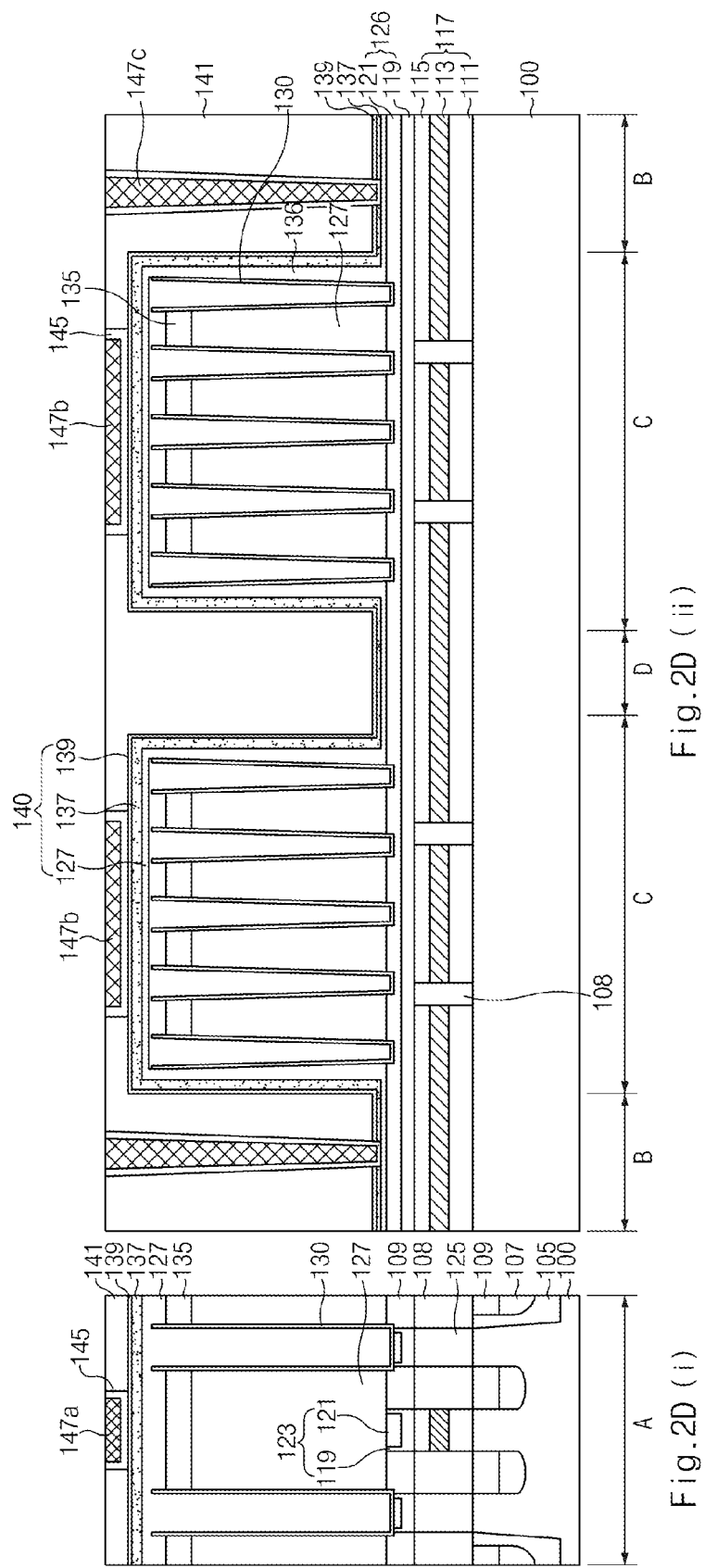

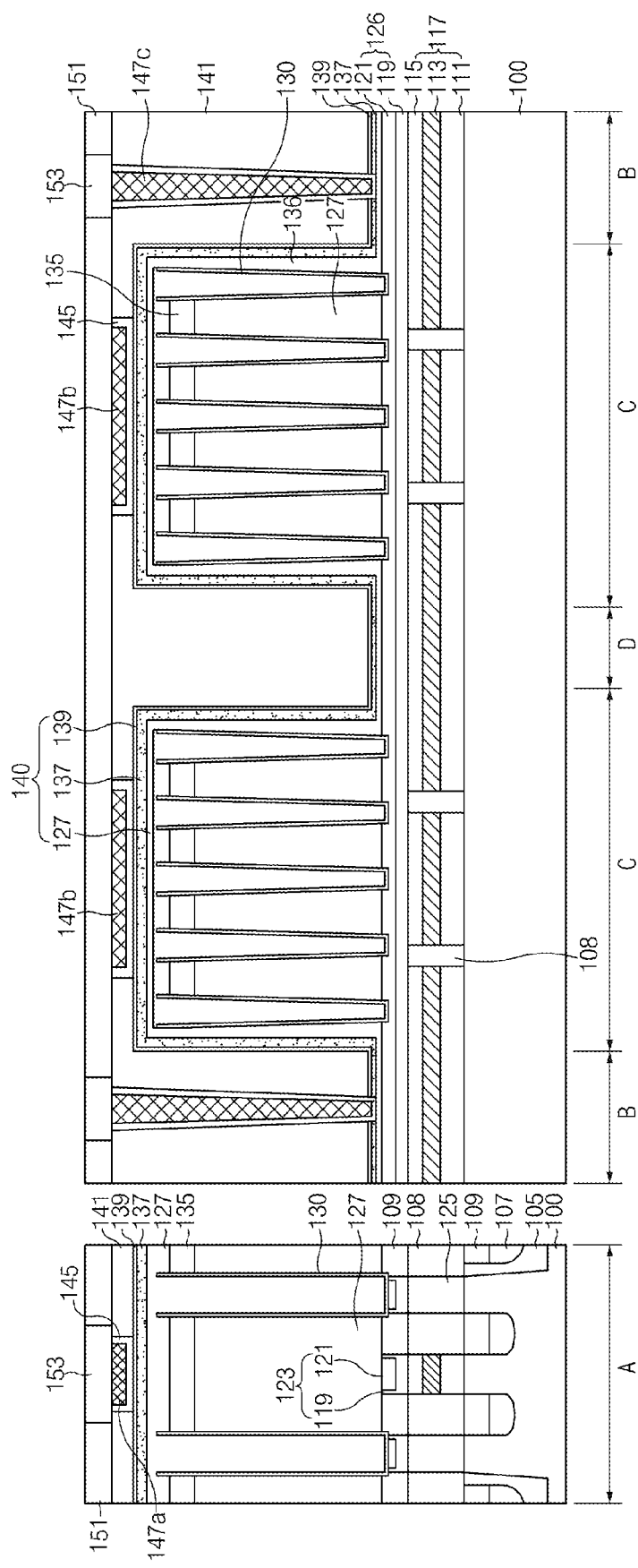

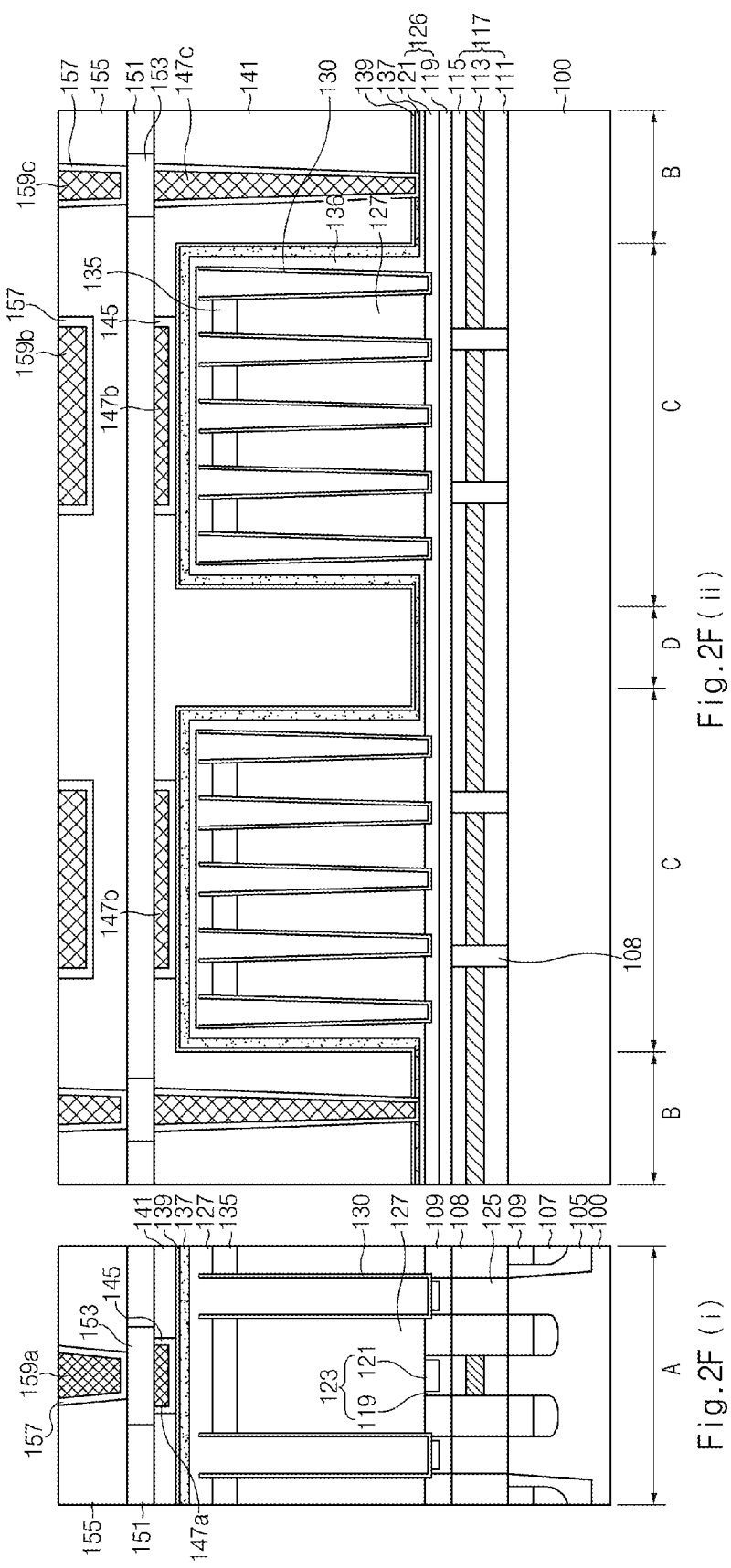

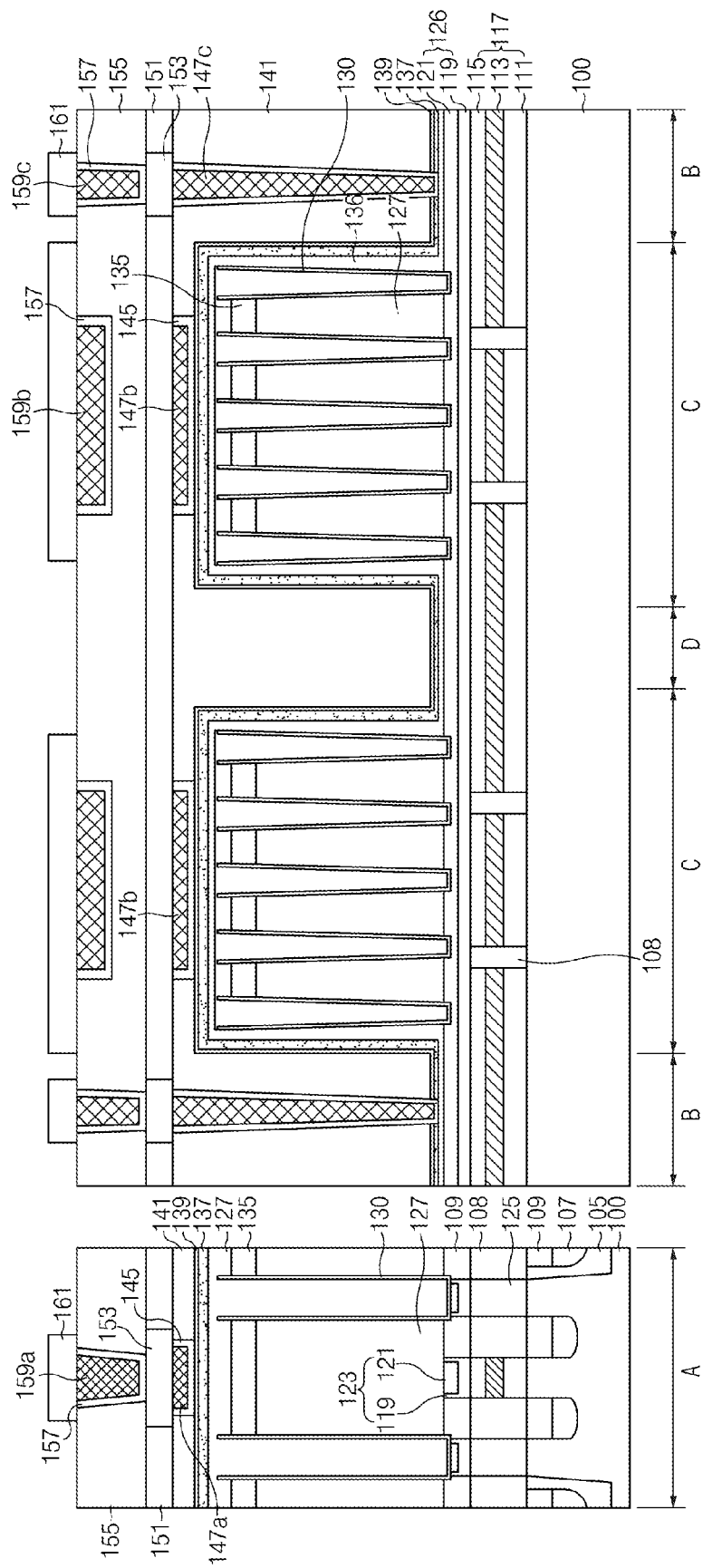

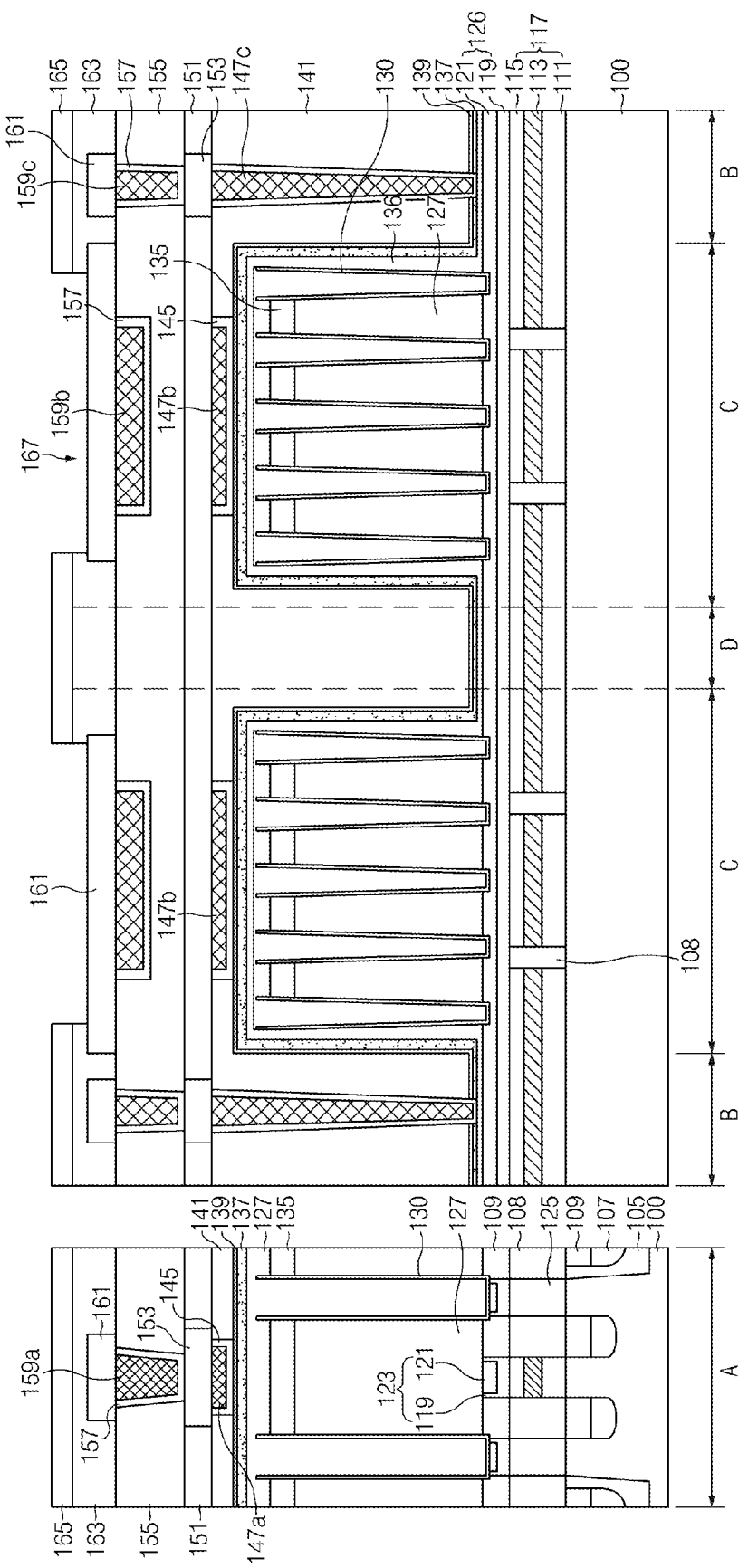

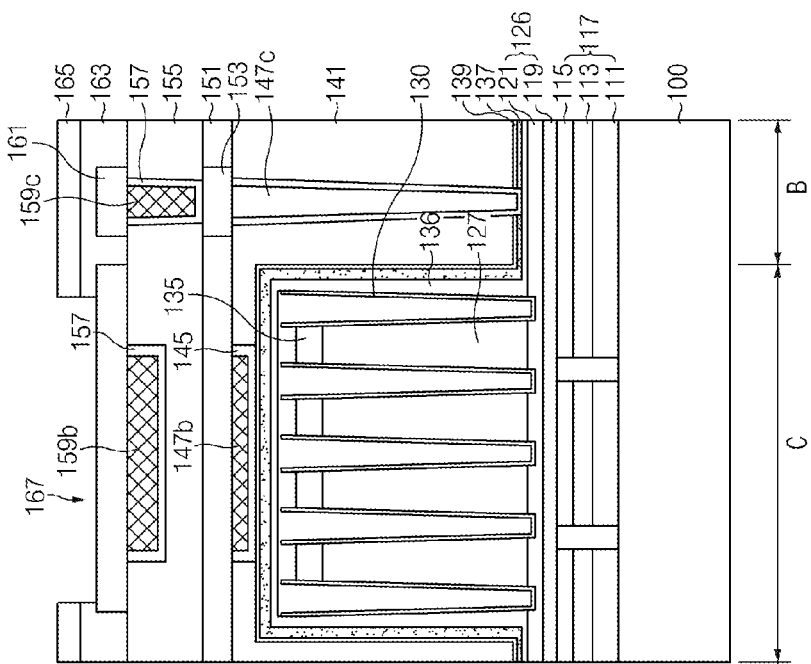
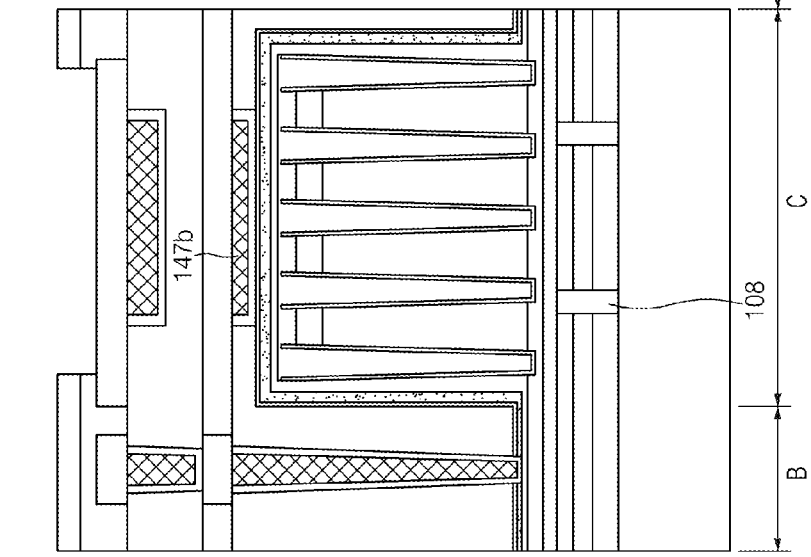
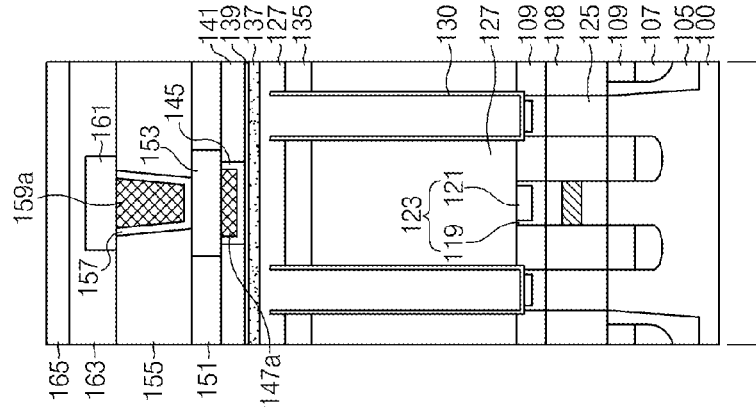
Fig.3(i)  Fig.3(ii)

SEMICONDUCTOR DEVICE AND METHOD FOR FORMING THE SAME

CROSS-REFERENCE TO RELATED APPLICATION

Priority to Korean patent application No. 10-2014-0030355, filed on 14 Mar. 2014, the disclosure of which is hereby incorporated in its entirety by reference, is claimed.

BACKGROUND

Generally, highly-integrated semiconductor devices have been formed by stacking conductive layers (for example, a conductive layer including a metal film and an insulation layer), and by interconnecting stacked conductive layers. The number of stacked conductive layers increases as these semiconductor devices become more precise and complicated. After the desired number of conductive layers are stacked, a bonding pad having a multi-layer structure that includes a plurality of conductive films is formed.

The bonding pad has a line structure disposed over a surface of the integrated circuit and is configured to provide a contact surface between an external pin lead and an internal circuit of the semiconductor device. A bonding wire provides an electrical contact between the pin lead and the bonding pad. During attachment of the bonding wire to the bonding pad, an end portion of the bonding wire is positioned to contact the bonding pad using a precise position adjustment machine. The machine exerts force on the bonding pad and causes deformation of an internal portion of the semiconductor device. For example, a lower portion of a pad region including a metal-oxide-semiconductor (MOS) capacitor and a specific circuit, which are used to reduce noise of the semiconductor device, may deform until a defect such as a crack or a void occurs in the semiconductor device. As a result, a micro bridge may form in the pad region and the peripheral region. In addition, as the degree of integration increases, the size of a region between two neighboring pad regions is reduced, and it becomes more difficult to form one or more conductive lines between the pad regions.

BRIEF SUMMARY

Various embodiments of the present disclosure are directed to providing a semiconductor device and a method for forming the same that address one or more issues of the related art.

Embodiments of the present disclosure relate to a semiconductor device and a method of forming the same that reduce the occurrence of a crack in a portion of a pad region. Embodiments of the present disclosure also relate to increasing the design rule margin between pad regions.

Embodiments of the present disclosure relate to a semiconductor device and a method for forming the same that reduces or prevents the occurrence of a defect (e.g., a crack or void) in a MOS capacitor or a circuit, which are disposed at a lower part of the pad region. Embodiments are also directed to improving device characteristics by increasing a design rule margin between pad regions.

In accordance with an embodiment, a semiconductor device includes: a first pad region formed to include a plurality of storage nodes; a second pad region arranged adjacent to the first pad region, and formed to include a plurality of storage nodes; a coupling portion disposed between the first pad region and the second pad region; and a plate electrode arranged not only along a surface of the storage node of the first pad region but also along a surface of the storage node of the second pad region, and coupled to the coupling portion between the first pad region and the second pad region.

The semiconductor device may further include: a peripheral region and a cell region arranged adjacent to the first pad region and the second pad region, respectively. The semiconductor device may further include: a metal oxide semiconductor (MOS) transistor formed over semiconductor substrates of the cell region, the pad region, and the peripheral region. The MOS transistor may include a stacked structure of a polysilicon layer, a metal layer, and a hard mask layer. The semiconductor device may further include: a first metal line formed over the MOS transistor. The semiconductor device may further include: a storage node contact plug located at both sides of the MOS transistor of the cell region; and a storage node coupled to the storage node contact plug.

The storage node of the cell region may be located at the same level as the storage nodes of the first pad region and the second pad region. The semiconductor device may further include: a support film pattern interposed between the storage nodes.

The plate electrode may further include a stacked structure of a titanium nitride (TiN) film, a silicon germanium (SiGe) film, and a tungsten (W) film.

The semiconductor device may further include: a first contact plug formed over the first metal line in the peripheral region; a second metal line formed over the first contact plug; a second contact plug formed over the second metal line; and a third metal line formed over the second contact plug.

The semiconductor device may further include: a first contact pad formed over the plate electrode; a second contact pad formed over the first contact pad; and a metal pad formed over the second contact pad. The first contact pad and the second contact pad may be spaced apart from each other by an insulation layer.

The semiconductor device may further include: a pad open portion configured to expose the metal pad of the pad region by a passivation layer formed over the metal pad.

In accordance with an embodiment, a method for forming a semiconductor device that includes a first pad region, a second pad region, and a coupling portion between the first pad region and the second pad region includes: forming a storage node over semiconductor substrates of the first pad region and the second pad region; forming a plate electrode over an entire surface of the semiconductor substrates of the first pad region, the second pad region, and the coupling portion, each of which includes the storage node.

The method may further include: forming a peripheral region and a cell region arranged adjacent to the first pad region and the second pad region, respectively. The method may further include: forming a buried gate in the semiconductor substrate of the cell region. The method may further include: forming a metal oxide semiconductor (MOS) transistor over semiconductor substrates of the cell region, the pad region, and the peripheral region.

The forming the MOS transistor may include: forming a stacked structure of a polysilicon layer, a metal layer, and a hard mask layer over the semiconductor substrate, and patterning the stacked structure.

The method may further include: forming a first metal line over the MOS transistor of the first pad region, the second pad region, and the peripheral region.

The method may further include: forming an insulation layer over the semiconductor substrate including the MOS transistor of the cell region; forming a contact hole exposing the semiconductor substrate of both sides of the MOS transistor by etching the insulation layer; forming a storage node contact plug by burying a conductive material in the contact hole; and forming a storage node coupled to the storage node contact plug.

The forming the storage node may further include: forming a sacrificial film over the semiconductor substrate; forming a storage node region by etching the sacrificial film; forming a storage node conductive material over the storage node region; and removing the sacrificial film.

The method may further include: after the formation of the storage node conductive material, recessing a sacrificial film between the storage node regions; and forming a support film pattern over the recessed sacrificial film.

The storage node of the cell region may be formed while simultaneously forming the storage nodes of the first pad region and the second pad region. The plate electrode may further include a stacked structure of a titanium nitride (TiN) film, a silicon germanium (SiGe) film, a tungsten (W) film, or a combination thereof.

The method may further include: forming a first interlayer insulation layer over an entire surface of the semiconductor substrate including the plate electrode; forming a first trench exposing the plate electrode by etching the first interlayer insulation layer; forming a first contact pad by burying a conductive material in the first trench; forming a second interlayer insulation layer over an entire surface including the first contact pad; forming a second trench by partially etching the second interlayer insulation layer; and forming a second contact pad by burying a conductive material in the second trench.

The method may further include: forming a metal pad coupled to the second contact pad; forming a passivation layer over an entire surface including the metal pad; and forming a pad open portion exposing the metal pad by etching the passivation layer.

The method may further include: forming a first contact plug coupled to the plate electrode in the peripheral region; forming a second metal line coupled to the first contact plug; forming a second contact plug over the second metal line; and forming a third metal line over the second contact plug.

The method may further include: forming a first contact pad coupled to the plate electrode in the cell region; forming a second metal line coupled to the first contact pad; forming a second contact pad over the second metal line; and forming a third metal line over the second contact pad.

It is to be understood that both the foregoing general description and the following detailed description of the present disclosure should not be construed as limiting, but are intended to provide further explanation of the invention as claimed.

BRIEF DESCRIPTION OF THE DRAWINGS

FIGS. 1A(i) and 1A(ii) are plan views illustrating a semiconductor device according to an embodiment.

FIGS. 1B(i) and 1B(ii) are cross-sectional views illustrating a semiconductor device according to an embodiment.

FIGS. 2A(i) and (ii) to 2H(i) and (ii) are cross-sectional views illustrating a method for forming a semiconductor device according to an embodiment.

FIGS. 3(i) and 3(ii) are cross-sectional views illustrating a semiconductor device according to an embodiment.

DESCRIPTION OF EMBODIMENTS

Reference will now be made in detail to embodiments, some of which are illustrated in the accompanying drawings. Wherever possible, the same reference numbers are used throughout the drawings to refer to the same or like portions. A semiconductor device and a method for forming the same according to embodiments will hereinafter be described with reference to the accompanying drawings.

FIGS. 1A and 1B are plan views and cross-sectional views illustrating a semiconductor device according to an embodiment.

Referring to FIG. 1A(i), a plurality of metal pads 161 are arranged in a direction along an X-axis (hereinafter, "an X-axis direction") and in a direction along a Y-axis (hereinafter, "a Y-axis direction").

FIG. 1A(ii) is an enlarged view illustrating a portion of the semiconductor device shown in FIG. 1A(i), which includes two metal pads 161. A peripheral region B is located at one side of each pad region C, and a coupling portion D is disposed between neighboring pad regions C. These pad regions C are interconnected through a plate electrode 140. The plate electrode 140 may interconnect two pad regions C arranged along a first direction (e.g., an X-axis direction), and may interconnect two pad regions C arranged along a second direction (e.g., a Y-axis direction).

A metal pad 161 is disposed in the pad region C, and a plurality of storage nodes 130 is disposed in the metal pad 161. In addition, a plurality of contact plugs 147c is disposed in the peripheral region B located at one side of the pad region C. A plate electrode 140 is disposed over a surface including two pad regions C. In an embodiment, the plate electrode 140 completely covers both pad regions C. The plate electrode 140 may be disposed over the coupling portion D between the pad regions C. Thus, in an embodiment, the plate electrode 140 may serve as substitute for one or more conductive lines disposed between the pad regions in a conventional semiconductor device.

FIGS. 1B(i) and (ii) are cross-sectional views illustrating a semiconductor device according to an embodiment.

Referring to FIGS. 1B(i) and (ii), the semiconductor device includes a cell region A, a pad region C, a peripheral region B, and a coupling portion D. The coupling portion D connects and is disposed between neighboring pad regions C.

A semiconductor substrate 100 including an active region and a device isolation film 105 is disposed in the cell region A. A buried gate electrode having a stacked structure, which includes a conductive material 107 and a sealing film 109, is disposed in the active region and the device isolation film 105.

A MOS transistor 117 may be formed over the semiconductor substrate 100 of the cell region A, the pad region C, and the peripheral region B. In an embodiment, a first storage node contact plug 125 and a second storage node contact plug 123, both of which are coupled to the semiconductor substrate 100, are located at both sides of the MOS transistor 117 of the cell region A. A first metal line 126 formed of a stacked structure of a barrier metal layer 119 and a conductive material 121 may be formed over the MOS transistors 117 of the pad region C and the peripheral region B. The MOS transistors 117 may be spaced apart from each other by a first interlayer insulation layer 108.

A plurality of storage nodes 130 coupled to the second storage node contact plug 123 may be disposed in the cell region A. A plurality of storage nodes 130 coupled to the first metal line 126 may be disposed in the pad region C and the peripheral region B. In an embodiment, the storage node 130 of the cell region A and the storage node 130 of the pad region C are located at the substantially same level. For example, with respect to the orientation of FIG. 1B, a bottom surface of the storage node 130 of the cell region A is disposed at the substantially same vertical level as a bottom surface of the storage node 130 of the pad region C. A support pattern 135 for preventing each storage node 130 from leaning may also be disposed between the storage nodes 130.

A dielectric film (not shown) is disposed over the storage node 130, and a plate electrode 140 is disposed over a surface including the storage node 130 and the dielectric film (not shown). The plate electrode 140 may have a stacked structure that includes a titanium nitride (TiN) pattern 127, a silicon germanium (SiGe) film 137, and a tungsten (W) film 139. The plate electrode 140 may also be disposed in the coupling portion D between two neighboring pad regions C.

The plate electrode 140 interconnecting the neighboring pad regions C may serve as a buffer layer that reduces stress on a lower portion of the semiconductor device including circuit elements, such as a MOS transistor 117. Such stress may be applied to a lower portion of the semiconductor device, when, for example, a bonding wire is attached to a metal pad 161 (or a bonding pad). Since the plate electrode 140 serving as the buffer layer may reduce the stress applied to the lower portion of the semiconductor device, the plate electrode 140 may prevent a defect (e.g., a crack or a void) from forming in the lower portion. As a result, the plate electrode may also prevent an electric bridging between the pad region C and the peripheral region B from occurring.

In addition, a conventional semiconductor device typically includes one or more metal lines interconnecting neighboring pad regions. In accordance with an embodiment, the plate electrode 140 may be used instead of one or more of these metal lines. As a result, the margin of a design rule margin can be guaranteed against the coupling portion D between the neighboring pad regions C in an embodiment of the present disclosure, compared to that of the conventional semiconductor device.

A method for forming a semiconductor device according to an embodiment will hereinafter be described with reference to FIGS. 2A to 2H. FIGS. 2A to 2H are cross-sectional views illustrating a method for forming the semiconductor device according to an embodiment. FIGS. 2A(i) to 2H(i) illustrate a cell region A. FIGS. 2A(ii) to 2H(ii) illustrate a peripheral region B, a pad region C, and a coupling portion D. A coupling portion D is disposed between two neighboring pad regions C.

Referring to FIGS. 2A(i) and (ii), a semiconductor substrate 100 includes the cell region A, the pad region C, and the peripheral region B. A device isolation film 105 is formed to define an active region in the semiconductor substrate 100 of the cell region A. Recesses are formed by etching the active region and the device isolation film 105. Subsequently, a gate conductive material 107 is buried in a lower portion of the recess. Thereafter, a sealing film 109 is buried in an upper portion of the recess over the gate conductive material 107 to form a buried gate electrode, which is electrically isolated from a neighboring gate conductive material 107.

Thereafter, a polysilicon layer, a metal layer, and a hard mask layer are sequentially formed over substantially all of an entire surface of the semiconductor substrate 100 including the cell region A in which the buried gate electrode is formed. Then, these materials are patterned to form a polysilicon pattern 111, a metal pattern 113, and a hard mask pattern 115 included in the MOS transistor 117. Subsequently, a first interlayer insulation layer is formed over the entire surface including the MOS transistor 117, and is planarized until a top surface of the hard mask pattern 115 of the MOS transistor 117 is exposed. The remaining portion of the first interlayer insulation layer is buried between the MOS transistors 117.

Subsequently, the remaining portion of the first interlayer insulation layer in the cell region A is etched to form the first interlayer insulation pattern 108, which defines a storage node contact hole exposing the active region. A conductive material is buried in the storage node contact hole, so that a first storage node contact plug 125 is formed.

Subsequently, an insulation layer 109 is formed over the first interlayer insulation pattern 108 and the first storage node contact plug 125 of the cell region A. The insulation layer 109 is patterned so that a contact hole exposing the first storage node contact plug 125 is formed. Thereafter, a barrier metal layer 119 and a conductive layer 121 are formed, not only over the contact hole of the cell region A, but also over the MOS transistor 117 and the first interlayer insulation pattern 108 of the pad region C and the peripheral region B. In an embodiment, the stacked barrier metal layer 119 and conductive layer 121 in the pad region C and the peripheral region B form a first metal line 126. In an embodiment, the barrier metal layer 119 and the conductive layer 121 that are buried in the cell region A form a second storage node contact plug 123.

Referring to FIGS. 2B(i) and (ii), a sacrificial insulation layer (not shown) is formed, not only over the first interlayer insulation pattern 108 and the second storage node contact plug 123 of the cell region A, but also over the metal line 126 of the pad region C. The sacrificial insulation layer (not shown) is etched so that a storage node region is formed exposing some portions of the second storage node contact plugs 123 of the cell region A and some portions of the conductive layer 121 of the pad region C. In an embodiment, the sacrificial insulation layer is an oxide layer.

Subsequently, a conductive material for a storage node is deposited along a surface of the storage node region. This storage node conductive material may be formed as a metal nitride film, and may include a material such as titanium nitride (TiN), tantalum nitride (TaN), tungsten nitride (WN), or a combination thereof, or may be formed as a precious metal layer such as ruthenium (Ru), platinum (Pt), iridium (Ir), or a combination thereof. In an embodiment, the storage node conductive material is evenly deposited over the storage node region. In an embodiment, an Atomic Layer Deposition (ALD) or Chemical Vapor Deposition (CVD) process may be used so that the storage node conductive material can be deposited with a thin and even thickness.

Subsequently, an upper portion of the sacrificial insulation layer (not shown) is partially etched, and a support pattern 135 is formed over the etched sacrificial insulation layer (not shown). The support pattern 135 may be formed of a nitride film that has an etch selection ratio that is different from that of the sacrificial insulation layer. For example, in an embodiment, the support pattern 135 has an etch rate that is lower than an etch rate of the sacrificial insulation layer. Then, the sacrificial insulation layer (not shown) is removed through dip-out processing, resulting in formation of a storage node 130. In an embodiment, the support pattern 135 may be formed between the storage nodes 130 to prevent the storage nodes 130 from leaning in the dip-out process. As described above, in an embodiment, the storage node 130 of the pad region C is formed while forming the storage node 130 of the cell region A. As a result, an additional process for forming the storage node 130 of the pad region C may be omitted, thus simplifying fabrication and reducing a processing time.

A dielectric film (not shown) is formed along the surfaces of the storage node 130. The dielectric film (not shown) may include titanium oxide ($TiO_2$), zirconium dioxide ($ZrO_2$), hafnium oxide ($HfO_2$), aluminum oxide ($Al_2O_3$), Barium Strontium Titanate (BST, Ba1-xSrxTiO$_3$), Strontium Bismuth Titanate (SBT, $SrBi_2Ti_2O_9$), or a combination thereof. Thereafter, the plate electrode 140 is formed over the substantially all of the entire upper portion of the resultant structure, including the dielectric film (not shown). The plate electrode 140 may have a stacked structure including a TiN pattern 127, a SiGe film 137, and a tungsten (W) film 139. In an embodiment, the plate electrode 140 may also be formed at the coupling portion D between the neighboring pad regions C.

In an embodiment, the plate electrode 140 is formed to interconnect neighboring pad regions C. The plate electrode 140 may serve as a buffer layer that reduces the stress applied to a lower portion of the semiconductor device, which includes circuit elements such as a MOS transistor 117. Such stress may be applied, for example, when a wire is bonded to a metal pad (see 161 of FIG. 2H(ii)) in an open pad portion (see 167 of FIG. 2H(ii)).

That is, when external force is applied to the metal pad, the energy produced by the external force is transferred to the semiconductor device. The plate electrode 140 deforms to store some of the transferred energy in the form of elastic potential energy. Even if the plate electrode does not absorb all of the energy from the external force, the amount of external energy transferred to the lower portion of the semiconductor device is reduced compared to a conventional semiconductor device that does not have a plate electrode 140. Thus, circuit elements (e.g., a MOS transistor 117) in the lower portion may be protected, a defect (e.g., a crack or a void) in the lower portion can be prevented, and an electric bridging between the pad region C and the peripheral region B can be prevented.

In addition, the plate electrode 140 may serve as a buffer layer that reduces the stress applied to an upper portion of the semiconductor device. Due to the elastic energy stored in the plate electrode 140, the amount of external energy transferred to an upper portion of the semiconductor device is also reduced. As a result, elements (see, e.g., metal pad 161, third interlayer insulation layer 151, and second metal line 153 of FIG. 2H(ii)) in the upper portion of the peripheral region B, the pad region C, and the coupling portion D may be protected and a defect (e.g., a crack or a void) prevented.

Referring to FIGS. 2C(i) and (ii), a second interlayer insulation layer is formed over substantially all of an entire surface of the semiconductor substrate 100 including the plate electrode 140. Subsequently, the second interlayer insulation layer is etched to form a second interlayer pattern 141, first trenches (143a, 143b) exposing the plate electrodes 140 of the cell region A and the pad region C, and at the same time a first contact hole 143c exposing the first metal line 123 of the peripheral region B.

Referring to FIGS. 2D(i) and (ii), a first barrier metal film 145 is formed not only over the first trenches (143a, 143b) of the cell region A and the pad region C, but also over the first contact hole 143c of the peripheral region B. A conductive material is buried in the first trenches (143a, 143b) and the first contact hole 143c, so that the first contact pads (147a, 147b) and the first contact plug 147c are formed. In an embodiment, the first barrier metal film 145 may be formed of a material including titanium (Ti) or titanium nitride (TiN), and the conductive material may be formed of a material including tungsten (W).

In an embodiment, the first contact pad 147b formed in the pad region C may also serve as a buffer layer that reduces stress applied to a lower portion of the semiconductor device including circuit elements, such as a MOS transistor 117. Such stress may be applied, for example, when a wire is bonded to a metal pad (see, e.g., 161 of FIG. 2H(ii)) in an open pad portion (see, e.g., 167 of FIG. 2H(ii)). As a result, circuit elements in the lower portion of the peripheral region B, the pad region C, and the coupling portion D may be protected and a defect (e.g., a crack or a void) may be prevented. Thus, an electric bridging between the pad region C and the peripheral region B may also be prevented. In addition, the first contact pad 147b may serve as a buffer layer that reduces stress applied to an upper portion of the semiconductor device. As a result, elements in the upper portion of the peripheral region B, the pad region C, and the coupling portion D may be protected and a defect (e.g., a crack or a void) may be prevented.

Referring to FIGS. 2E(i) and (ii), a third interlayer insulation layer is formed over a second interlayer insulation pattern 141, which includes the first contact pads (147a, 147b) and the first contact plug 147c. The third interlayer insulation layer may be formed of a nitride film, an oxide film, or a stacked structure thereof. Subsequently, the third interlayer insulation layer of the cell region A and the peripheral region B is etched to form a third interlayer insulation pattern 151, so that a trench exposing the first contact pad 147a and the first contact plug 147c is formed. Thereafter, a metal layer is buried in the trench so that a second metal line 153 is formed. For example, the second metal line 153 may be a copper (Cu) line.

Referring to FIGS. 2F(i) and (ii), a fourth interlayer insulation layer is formed over the third interlayer insulation layer 151 and the second metal line 153. In an embodiment, the fourth interlayer insulation layer may be formed of a material including Tetra Ethyle Ortho Silicate (TEOS). Subsequently, a portion of the fourth interlayer insulation layer of the pad region C is partially etched so that a second trench is formed. A portion of the fourth interlayer insulation layer in the cell region A and the peripheral region B is etched so that a second contact hole exposing the second metal line 153 is formed. The fourth interlayer insulation layer is etched to form a fourth interlayer insulation pattern 155. After a second barrier metal film 157 is formed in the second trench and the second contact hole, a conductive material is buried in the second trench and the second contact hole, so that a second contact pad 159b is formed in the pad region C and the second contact plugs (159a, 159c) are formed in the cell region A and the peripheral region B. In an embodiment, the second barrier metal film 157 may be a titanium (Ti) film or a titanium nitride (TiN) film, and the conductive material may be formed of tungsten (W).

In an embodiment, the second contact pad 159b may also serve as a buffer layer that reduces stress applied to a lower portion of the semiconductor device including a MOS transistor 117. Such stress may be applied, for example, when a wire is bonded to a metal pad in an open pad portion. As a result, circuit elements (e.g., a MOS transistor 117) in the lower portion of the peripheral region B, the pad region C, and the coupling portion D may be protected and a defect (e.g., a crack or a void) may be prevented. As a result, an electric bridging between the pad region C and the peripheral region B may also be prevented. In addition, the second contact pad 159b may serve as a buffer layer that reduces stress applied to an upper portion of the semiconductor device. As a result, elements in the upper portion in the peripheral region B, the pad region C, and the coupling portion D may be protected and a defect (e.g., a crack or a void) may be prevented.

Referring to FIGS. 2G(i) and (ii), a plurality of third metal lines 161, each of which is respectively coupled to the second contact pad 159b and the second contact plugs (159a, 159c), is formed over the fourth interlayer insulation layer 155, the second contact pad 159b, and the second contact plugs (159a, 159c). The third metal line 161 formed in the pad region C may be referred to as a metal pad. Here, the third metal line 161 may be formed of a material including aluminum (Al).

Referring to FIGS. 2H(i) and (ii), a first passivation layer and a second passivation layer are formed over the third metal lines 161. Then, the second passivation layer and the first passivation layer of the pad region C are etched to form a first passivation pattern 163 and a second passivation pattern 165, to define an open pad portion 167 exposing a portion of the third metal line 161 (or a metal pad). In an embodiment, the first passivation pattern 163 may be formed of a high density plasma (HDP) oxide film, and the second passivation pattern 165 may be formed of a material including a nitride film.

In accordance with embodiments of the present disclosure, the storage node 130, the plate electrode 140, the first contact pad 147b, and the second contact pad 159b, which are formed in the pad region C, serve as a buffer for stress. As a result, stress applied to a lower portion of the semiconductor device including circuit elements (e.g., a MOS transistor located in the pad region C), may be reduced. Such stress may be applied when, for example, a bonding wire is attached to the metal pad 161. Thus, an electric bridging between the pad region C and the peripheral region B may be prevented. In addition, one or more metal lines are typically formed between neighboring pad regions of a conventional semiconductor device. Since at least some of these metal lines can be replaced with the plate electrode 140, the margin of a design rule can be increased in the coupling portion D between the neighboring pad regions C in an embodiment of the present disclosure.

FIG. 3 is a cross-sectional view illustrating a semiconductor device according to an embodiment. After plate electrode 140, which is interposed between neighboring pad regions C, is removed as shown in FIG. 3, a failure verification process may be carried out in accordance with an embodiment as follows.

As can be seen from FIG. 3, the second passivation pattern 165, the first passivation pattern 163, the fourth interlayer insulation pattern 155, the third interlayer insulation pattern 151, the second interlayer insulation pattern 141, the plate electrode 140, the first metal line 126, the MOS transistor 117, and the semiconductor substrate 100, which are formed in the coupling portion D, are etched, so that the neighboring pad regions C are electrically isolated from each other.

Then, a probe test for each pad region C is carried out. Through the probe test, it may be possible to determine whether one or more circuit elements included in each pad region C are open or short. For example, if a crack occurs in the metal pad 161 of the pad region C or a bridge occurs between the metal pads 161 due to a slip phenomenon of the metal pads 161, the probe test may indicate a failure in the tested pad region C.

Embodiments of the present disclosure form a storage node in a pad region, and interconnect neighboring pad regions through a plate electrode.

Embodiments reduce the occurrence of a defect (e.g., a crack or void) in a lower portion of the pad region including a MOS transistor and other circuit elements.

In addition, in accordance with embodiments, since a plate electrode is formed in a coupling portion between pad regions, and can replace one or more of the metal lines interconnecting the pad regions of a conventional device, the number of metal lines formed between the pad regions can be reduced, and the margin of a design rule can be increased in the coupling portion.

Those skilled in the art will appreciate that embodiments of the present disclosure may be carried out in other ways other than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. Embodiments are not limited by the type of deposition, etching, polishing, and patterning steps described herein. Nor are embodiments limited to any specific type of semiconductor device. For example, embodiments may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A semiconductor device comprising:
   a first pad region including a plurality of first storage nodes;
   a second pad region neighboring the first pad region and including a plurality of second storage nodes;
   a coupling portion disposed between the first pad region and the second pad region;
   a continuous plate electrode disposed over the plurality of first storage nodes of the first pad region, the plurality of second storage nodes of the second pad region, and the coupling portion; and
   a peripheral region disposed adjacent to the first pad region in a direction parallel to top surfaces of the first and second storage nodes, the peripheral region including one or more of first metal oxide semiconductor (MOS) transistors.

2. The semiconductor device according to claim 1, further comprising:
   a cell region disposed adjacent to the second pad region.

3. The semiconductor device according to claim 2, further comprising:
   a plurality of second MOS transistors formed over a semiconductor substrate in the cell region and the pad regions.

4. The semiconductor device according to claim 3, wherein the first and second MOS transistors have a stacked structure including a polysilicon layer, a metal layer, and a hard mask layer.

5. The semiconductor device according to claim 3, further comprising:
   a first metal line disposed over the first and second MOS transistors.

6. The semiconductor device according to claim 5, further comprising:
   a first contact plug disposed over the first metal line in the peripheral region;
   a second metal line disposed over the first contact plug;
   a second contact plug disposed over the second metal line; and
   a third metal line disposed over the second contact plug.

7. The semiconductor device according to claim 3, further comprising:
   a storage node contact plug disposed at a side of a MOS transistor of the cell region; and
   a storage node disposed in the cell region and coupled to the storage node contact plug.

8. The semiconductor device according to claim 7, wherein the storage node of the cell region is located at substantially the same level as the plurality of first storage nodes of the first pad region and the plurality of second storage nodes of the second pad region.

9. The semiconductor device according to claim 1, further comprising:

a support pattern interposed between neighboring storage nodes of the plurality of first storage nodes and neighboring storage nodes of the plurality of second storage nodes.

10. The semiconductor device according to claim 1, wherein the plate electrode has a stacked structure including a titanium nitride (TiN) pattern, a silicon germanium (SiGe) film, and a tungsten (W) film.

11. The semiconductor device according to claim 10, wherein the tungsten (W) film of the plate electrode is disposed over sidewalls of the first storage nodes of the first pad region and the second storage nodes of the second pad region.

12. The semiconductor device according to claim 1, further comprising:
   a first contact pad disposed over the plate electrode;
   a second contact pad disposed over the first contact pad; and
   a metal pad disposed over the second contact pad.

13. The semiconductor device according to claim 12, wherein the first contact pad and the second contact pad are spaced apart from each other by an insulation layer.

14. The semiconductor device according to claim 12, further comprising:
   an open pad portion exposing a portion of the metal pad of the pad region, the open pad portion being defined by a passivation pattern formed over the metal pad.

15. The semiconductor device according to claim 1, wherein the plate electrode electrically connects the first pad region and the second pad region.

* * * * *